United States Patent [19]

Ishigaki

[11] Patent Number: 5,760,622

[45] Date of Patent: Jun. 2, 1998

[54] FREQUENCY CONVERTING CIRCUIT

[75] Inventor: Yukinobu Ishigaki, Miura, Japan

[73] Assignee: Victor Company of Japan, Ltd., Japan

[21] Appl. No.: 594,322

[22] Filed: Jan. 30, 1996

[51] Int. Cl.$^6$ .................... H04N 9/497; G11B 5/04
[52] U.S. Cl. .................... 327/113; 327/122; 327/256; 327/355; 327/99; 327/407
[58] Field of Search .................... 327/100, 113, 327/114, 116, 119, 122, 355, 356, 94, 403, 407, 129, 99, 256

[56] References Cited

FOREIGN PATENT DOCUMENTS 7152789  9/1982  Japan .................... 327/113

*Primary Examiner*—Timothy P. Callahan
*Assistant Examiner*—Dinh Le
*Attorney, Agent, or Firm*—Michael N. Meller

[57] ABSTRACT

This invention provides a frequency converting circuit that does not require balance adjustment, can be used in a broad frequency band, and is well-suited to implementation in the form of an integrated circuit. A first input signal undergoes a phase shift into $2^n$ (where n is a natural number of 2 or greater) respective channel signals, each with a different phase, for output. A second input signal is used to generate switch signals 10 numbered 1 ... n. The $2^n$ channel signals are switched according to the first switch signal, reducing the number of channels by ½, for output. The output of the (m-1) th switch (where m is a natural number of 2 ... n) is switched according to the mth switch signal, reducing the number of channels by ½ for output, at switch m. This process is repeated continuously from switches 2-n until the signal is output as a single channel signal.

3 Claims, 18 Drawing Sheets

FREQUENCY CONVERTING CIRCUIT

BACKGROUND OF THE INVENTION

1. Field of the Invention

The present invention relates to an improvement of a frequency converting circuit employing a phase shift type single sideband signal generation method and is suitable to be formed as an integrated circuit.

2. Description of Related Art

Frequency converting circuits or general means for obtaining single sideband signals are known. For example, after obtaining a double sideband signal with the carrier wave suppressed using a multiplier, a balanced modulator or a double balance mixer, the respective individual single sideband signals are selectively separated using a filter to generate the single sideband signal. This procedure is known. Another technique is to perform a 90-degree phase shift on both the carrier wave and the signal, feed the phase shifted signals to two balanced modulators, and either add or subtract the two signals output from the aforementioned two balanced modulators, thereby eliminating the need to use a filtering device in order to generate the phase shift type single sideband signal. This technique is disclosed in B. P. Lathi, Complete Guide to Digital-Analog Communication Methods, Volume 1, 226–251 (Mar. 28, 1985) [reference translation not verifiable], for instance.

When frequency conversion is performed on the frequency f1 of a first signal and the frequency f2 of a second signal, if the combined frequency is comparatively high and using a filter poses no problems, the previously described frequency converting circuit can easily obtain the sum frequency (f1+f2) and the difference frequency (f1−f2) with the use of a multiplier and filter. If, however, the first signal frequency f1 is particularly high and second signal frequency f2 is extremely low, it is almost impossible for filters to selectively separate the two signals.

The problem described above may be resolved through use of a phase shift type single sideband signal generation circuit.

This type of circuit does not require a filter, although, a simple filter is used in the actual circuit. Further, if the characteristics and adjustment of the circuit are perfect, this circuit can select f1+f2 or f1−f2 as desired while suppressing the nearby f1 without causing any problems.

Nevertheless, in actual circuitry balanced modulators can easily become unbalanced, while deviations can easily occur in the mixed levels of adder and subtracter circuits. This led to problems in selecting the output for either f1+f2 or f1−f2 as described previously. For example, selecting f1+f2 mixed the result with f1, which corresponds to the nearby suppressed carrier wave, and unwanted high-order frequency consisting mainly of the f1−f2 component. In some cases, it was impossible to remove unwanted frequencies even using a filter.

It became particularly problematic when the circuit described above was implemented as an integrated circuit. Since the various balance adjustments had to be performed outside the IC, the number of pins needed to be increased on the IC. This proved to be a problem, and it made it difficult to implement phase shift type single sideband signal generation circuits as ICs.

Previous examples will be discussed with reference to FIG. 1 and FIG. 2.

FIG. 1 presents a block diagram of an existing model of frequency conversion circuit. FIG. 2 is an operating wave chart of the output from the circuit in FIG. 1.

In FIG. 1, input signal A (A1 cos Pt) is supplied to input terminal 101, while input signal C (A2 cos Ct) is supplied to input terminal 105. These input signals A and C are supplied to $\pi/2$ phase shift circuits 103 and 106, respectively. Output from $\pi/2$ phase shift circuit 103 becomes signal B (A1 sin Pt), while output from $\pi/2$ phase shift circuit 106 becomes signal D (A2 sin Ct).

Multiplier (or balanced modulator) 102 multiplies input signal A (A1 cos Pt) by input signal C (A2 cos Ct).

Multiplier (or balanced modulator) 104 multiples output B (A1 sin Pt) from $\pi/2$ phase shift circuit 103 by output D (A2 sin Ct) from $\pi/2$ phase shift circuit 106.

Output from multipliers (or balanced modulators) 102 and 104 are described by the following equations (1) and (2).

$$A * C = A1 \cos Pt \cdot A2 \cos Ct \quad (1)$$
$$= (A1\,A2/2)\{\cos(P-C)t + \cos(P+C)t\}$$

$$B * D = A1 \sin Pt \cdot A2 \sin Ct \quad (2)$$
$$= (A1\,A2/2)\{\cos(P-C)t - \cos(P+C)t\}$$

Consequently, operator circuit 107 obtains A1 A2 cos (P−C)t when performing addition and A1 A2 cos (P+C)t when performing subtraction.

In FIG. 2, square wave C is used as the signal input to input terminal 105, although the input is not limited to a square wave. Circuits in actual use make use of balance modulators (double balance modulators or double balance mixers) as multipliers 102 and 104, and they switch signal A at input terminal 101 for signal C at input terminal 105. In this example switching output is obtained using square wave input.

Next we shall discuss the operating waveform chart in FIG. 2. Input signal A, which is input from input terminal 101, is supplied to multiplier 102 and to $\pi/2$ phase shift circuit 103, while input signal C, which is input from input terminal 105, is supplied to multiplier 102 and to $\pi/2$ phase shift circuit 106.

Multiplier 102 multiplies input signal A by input signal C, the result of which is output as output signal E. Multiplier 104 multiplies output signal B from $\pi/2$ phase shift circuit 103 by output signal D from $\pi/2$ phase shift circuit 106, the result of which is output as output signal F.

Arithmetic operation circuit 107 serves as an adder circuit that adds output signals E and F. As discussed previously, the frequency difference is obtained and output from output terminal 108 as output signal G. The waveform of output signal G is rather rough, but this output signal G is output via low pass filter (LPF) 109 from output terminal 110 as base wave component signal H.

If the frequency of input signal A is assumed to be 1 cycle, the basic frequency of input signal C is 4 cycles, and the basic frequency of input signal H is 3 cycles. Thus, the calculated results can be confirmed, since 4 cycles (frequency of input signal C)−1 cycle (frequency of input signal A)=3 cycles (frequency of input signal H).

The various waveforms shown in FIG. 2 represent ideal condition waveforms. Even the slightest loss of balance in the balanced modulators used as multipliers 102 and 104 will make it impossible to obtain the waveforms for output signals E and F shown in FIG. 2.

Moreover, even a very slight loss of mixing balance in the adding operation of operator circuit 107 will make it impossible to obtain the waveform shown for output signal G in FIG. 2.

BRIEF SUMMARY OF THE INVENTION

1. Object of the Invention

The purpose of this invention is to provide a frequency converting circuit suitable for implementation as an integrated circuit that requires no balance adjustment, can be used with a wide range of frequencies from low to high, and is based on the phase shift type single sideband signal generation method.

2. Brief Summary

According to aspect no. 1, this invention provides a frequency converting circuit for converting a frequency of a first input signal into another frequency in response to a second input signal, comprising:

Phase division means in which the aforesaid first input signal undergoes a phase shift into $2^n$ (where n is a natural number of 2 or greater) respective channel signals, each with a different phase, for output;

Switch signal generation means in which switch signals numbered 1 ... n are generated from the aforesaid second input signal;

First switching means in which the aforesaid multiple channel signals are switched according to the switch signals for the aforesaid first input signal, and the number of channels is reduced by ½ for output; and Switching means 2 ... n, in which the output of switching means m–1 (where m is a natural number from 2 to n) is switched according to the aforesaid switch signals and the number of channels is reduced by ½ for output in step m, and in which this process is continuously applied until the signal is output as a single channel signal.

According to aspect no. 2, this invention provides a frequency converting circuit for converting a frequency of a first input signal into another frequency in response to a second input signal, comprising:

a phase division means, in which 2n (where n is a natural number of 2 or greater) channel signals are output after undergoing a phase shift only at the distinct angles resulting from phase division of $2\pi$ [rad] phase angles by $2\pi/2^n$ [rad], based on the aforesaid first input signal;

a switch signal generation means, in which $2^n$ first and second switch signals are generated after undergoing a phase shift only at the distinct angles resulting from phase division of $2\pi$ [rad] phase angles by $2\pi/2^n$ [rad], based on the aforementioned second input signal;

a first switching means, in which the aforesaid $2^n$ channel signals are switched and output according to the respective aforementioned $2^n$ first switch- signals; and a second switching means, in which the output signal of the aforesaid first switching means is switched and output according to the aforesaid $2^n$ second switch signals, each of which has a phase difference of $\pi+(2\pi/2^n)$ [rad] in relation to the aforesaid corresponding first switch signals.

According to aspect no. 3, this invention provides a frequency converting circuit for converting a frequency of a first input signal into another frequency in response to a second input signal, comprising:

a first multiplier, which multiplies the first input signal by the second input signal;

a first phase shift circuit, which performs a–$\pi/2$ [rad] phase shift on the aforesaid first input signal;

a second phase shift circuit, which performs a–$\pi/2$ [rad] phase shift on the aforesaid second input signal;

a second multiplier, which multiplies the output signal from the aforesaid first phase shift circuit by the output signal from the aforesaid second phase shift circuit;

a frequency doubler, which generates switch signals by frequency doubling of the aforesaid second input signal; and a switching means, in which the output signal from the aforesaid first multiplier and the output signal from the aforesaid second multiplier are switched according to the aforementioned switch signals.

The above and other related objects and features of the invention will be apparent from a reading of the following description of the disclosure found in the accompanying drawings and the novelty thereof pointed out in the appended claims.

DETAILED DESCRIPTION OF THE INVENTION

The following passages contain detailed descriptions of preferred working examples of this invention, with reference to the attached illustrations.

<Basic Aspect 1>

Figure 3:
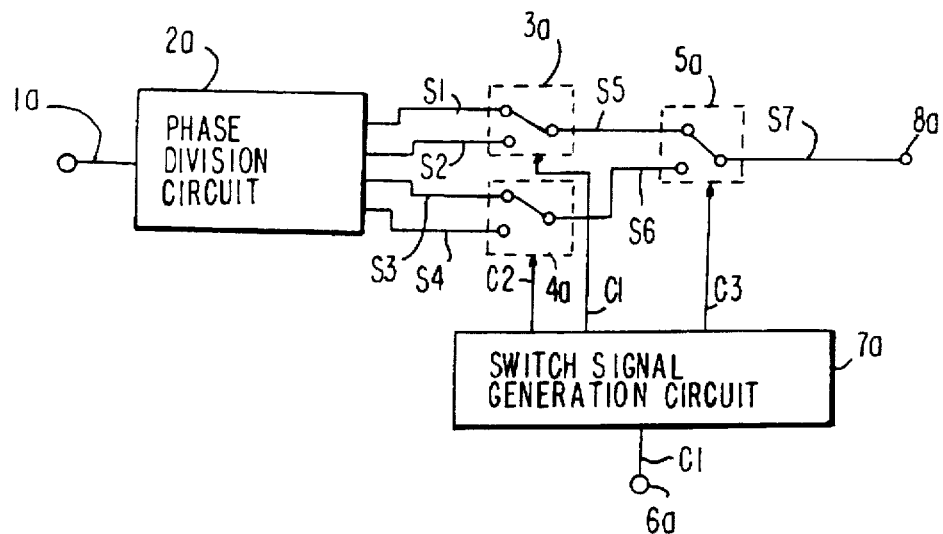
FIG. 3: Block diagram of a circuit presenting one example of a basic aspect of the frequency converting circuit which is the subject of this invention.

FIG. 3 consists of a block diagram of one example of a basic aspect of the frequency converting circuit of this invention.

The following is a description of the basic operations illustrated in FIG. 3.

The first input signal S1 is supplied to input terminal 1a. This input signal S1 is sent to the phase division circuit 2a, where it is transformed into the phase division signals S1–S4 (channel signals, 4 total channels in this example), each of which has a different phase.

At that point the phase division signals S1 and S2 are supplied to switch 3a (first switching means), while the phase division signals S3 and S4 are supplied to switch 4a (first switching means).

The second input signal C1 is supplied to input terminal 6a. The switch signal generator circuit 7a generates multiple switch signals (three in this example) C1–C3 from input signal C1. Switch signal C1 (first switch signal) is supplied to switch 3a (first switching means), switch signal C2 (first switch signal) is supplied to switch 4a (first switching means), and switch signal C3 (second switch signal) is supplied to switch 5a (second switching means).

Switches 3a and 4a output channel signals S1 and S2 plus channel signals S3 and S4, corresponding respectively to the switch signals C1 and C2. Output signals S5 and S6 from respective switches 3a and 4a are supplied to switch 5a where they are converted into output signals S5 and S6 according to switch signal C3 and are output from output terminal 8a as output signal S7.

In other words, the first input signal S1 is output from output terminal 8a in the form of output signal S7, which has undergone frequency conversion according to second input signal C1.

This particular example makes use of four channels, but if the number of channels is increased, the number of switch signals and the number of switches can also be increased.

It should be mentioned that a variety of conceivable methods can be used to combine the signals for conversion by the switches and to generate switch signals therefrom. Some of these methods will be mentioned in the specific circuit description examples to follow.

<Working Example 1>

Figure 4:
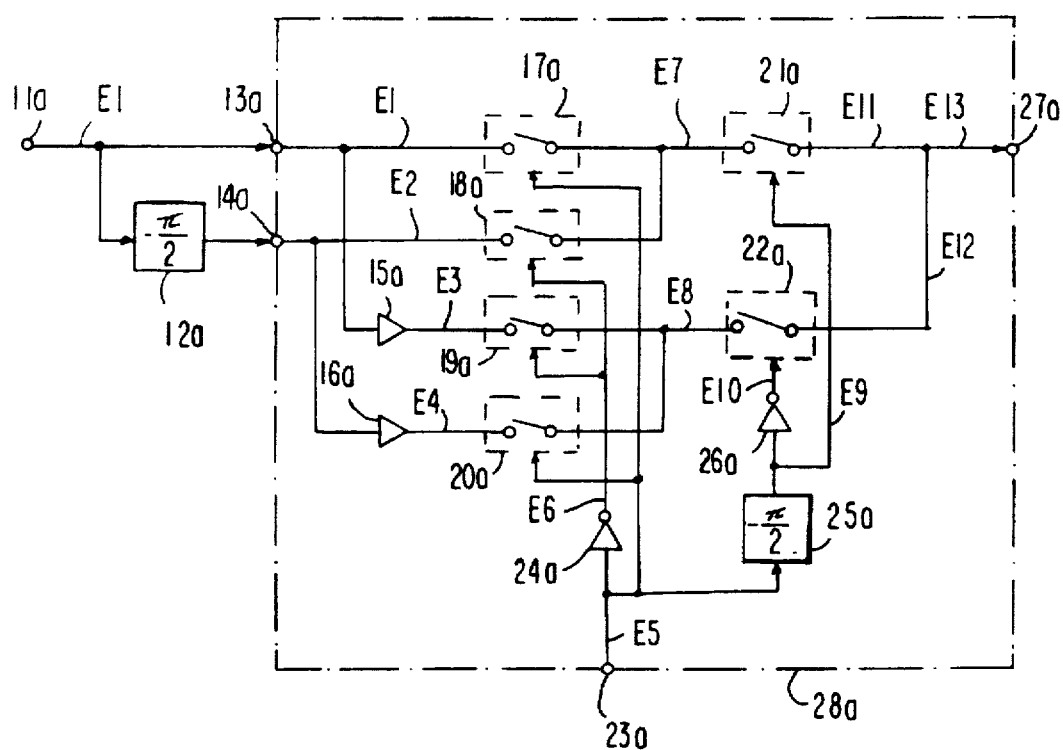
FIG. 4: Block diagram of the first working example of the frequency converting circuit of this invention.
Figure 5:
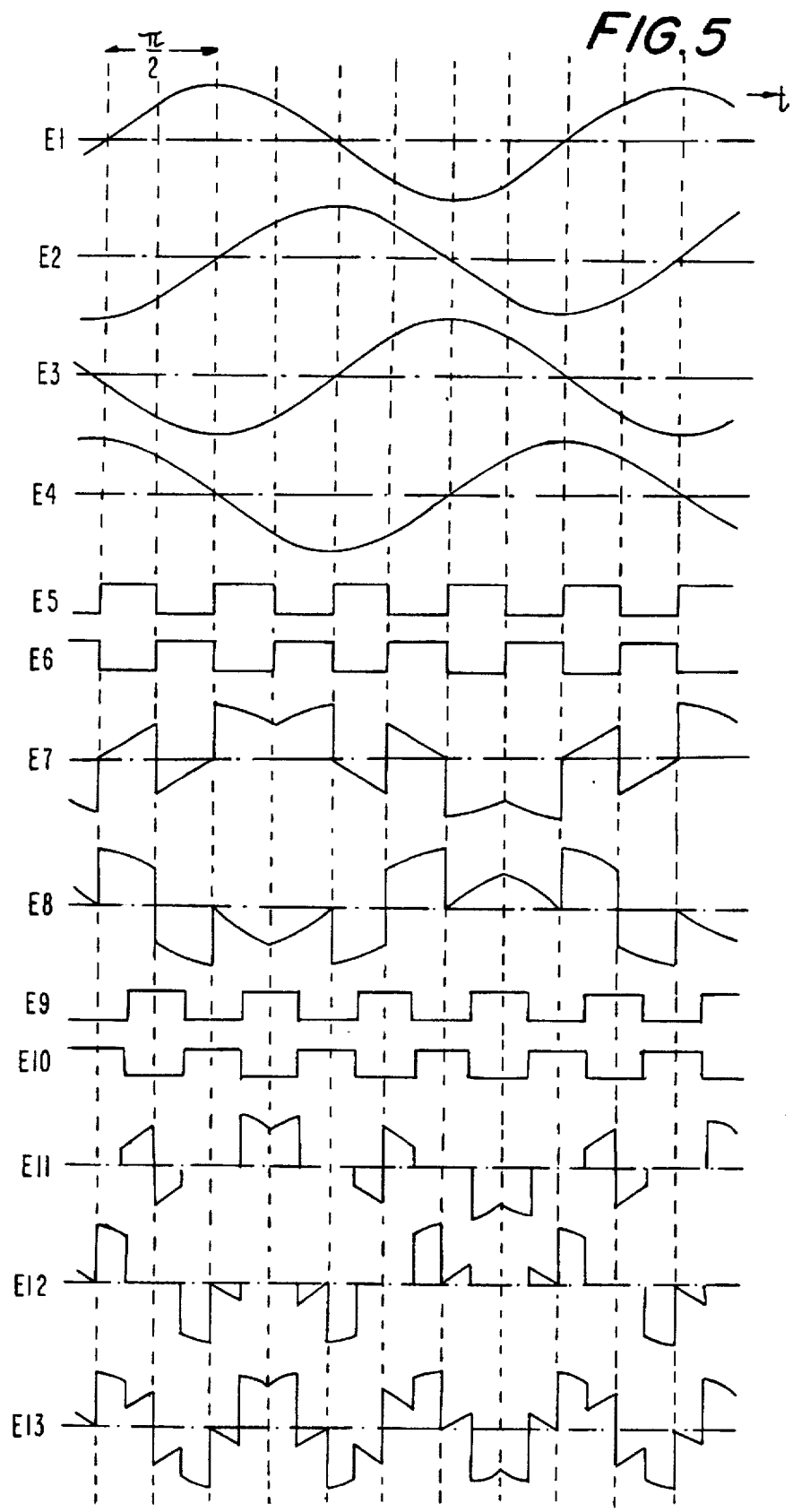
FIG. 5: Operating waveform chart of the circuit shown in FIG. 4.

FIG. 4 consists of a block diagram of the first working example of the frequency converting circuit of this invention. FIG. 5 presents an operating waveform chart for the same. The following discussion will refer to both figures together.

The frequency converting circuit illustrated in FIG. 4 represents one specific circuit configuration of the circuit illustrated in FIG. 3. In FIG. 4, the channel signals E1, E2, E3, and E4 shown in FIG. 5 are input as the channel signals S1, S2, S3, and S4 shown in FIG. 3 respectively. The same signals are used for switch signals C1 and C2, while a signal with a mutual phase difference of $\pi/2$ [rad (radian)] is used with switch signals C1 and C3.

Signals E2, E3 and E4 consist of phase-shifted channel signals with phase shift factors relative to E1 of $\pi/2$, $\pi$ and $3\pi/2$, respectively {in other words, channel signals phase-shifted only by the different angles from E1 obtained by phase division of the $2\pi$ [rad] phase angle by ($2\pi$/no. of channels (4)) [rad]}.

In FIG. 4, the first input signal E1, which is input from input terminal 11a, undergoes phase division into the following:

Channel signal E1;

Channel signal E3, a phase inversion of E1 via phase inversion amplifier 15a;

Channel signal E2, a phase shift of $-\pi/2$ [rad] E1 via $-\pi/2$ [rad] phase circuit 12a; and Channel signal E4, a phase inversion of output signal from $-\pi/b$ 2[rad] phase circuit 12a.

The phase-divided channel signals E1–E4 are supplied to switches 17a, 18a, 19a and 20a (first switching means), respectively.

The second input signal E5, which is input from input terminal 23a, is output in the form as follows:

Switch signal E5 (first switch signal);

Switch signal E6 (first switch signal), a phase inversion of switch signal E5 via inverter 24a;

Switch signal E9 (second switch signal), $-\pi/2$ rad phase shift via $-\pi/2$[rad] phase circuit 25a; and Switch signal E10 (second switch signal), a phase inversion of switch signal E9 via inverter 26a The switch signals E5, E6, E9 and E10 generated in this manner are supplied to switches 17a and 20a (first switching means), switches 18a and 19a (first switching means), switch 21a (second switching means) and switch 22a (second switching means), respectively.

In this example switch signal E5 is a signal with a duty ratio of 50%.

Signals are switched at switches 17a and 20a according to switch signal E5, and signals are switched at switches 18a and 19a according to switch signal E6.

Output signal E7 from switches 17a and 18a is supplied to switch 21a, while output signal E8 from switches 19a and 20a is supplied to switch 22a.

Switch signals E9 and E10 are switched at switches 21a and 22a, respectively, while output signals E11 and E12 are output. Ultimately output signal E13, the frequency of which is the difference between input signals E1 and E5, is output from output terminal 27a.

If we suppose that the first input signal E1 has a frequency of 1 cycle and the second input signal E2 has a frequency of 4 cycles, then the output signal E13 would have a frequency of 3 cycles, the difference between the two frequencies.

Furthermore, by using a simple low pass filter not shown, for example, it would be possible to obtain a signal with an almost ideal waveform from output signal E13.

Section 28a in the illustration, the area enclosed by a single-dot and dashed line, is the portion to be implemented as an integrated circuit. 13a and 14a are the IC input terminals, while 27a is the output terminal.

If we were to reverse channel signals E1 and E2 between terminals 13a and 14a, the result would be the frequency sum of the first input signal E1 and the second input signal E2.

<Working Example 2>

Figure 6:
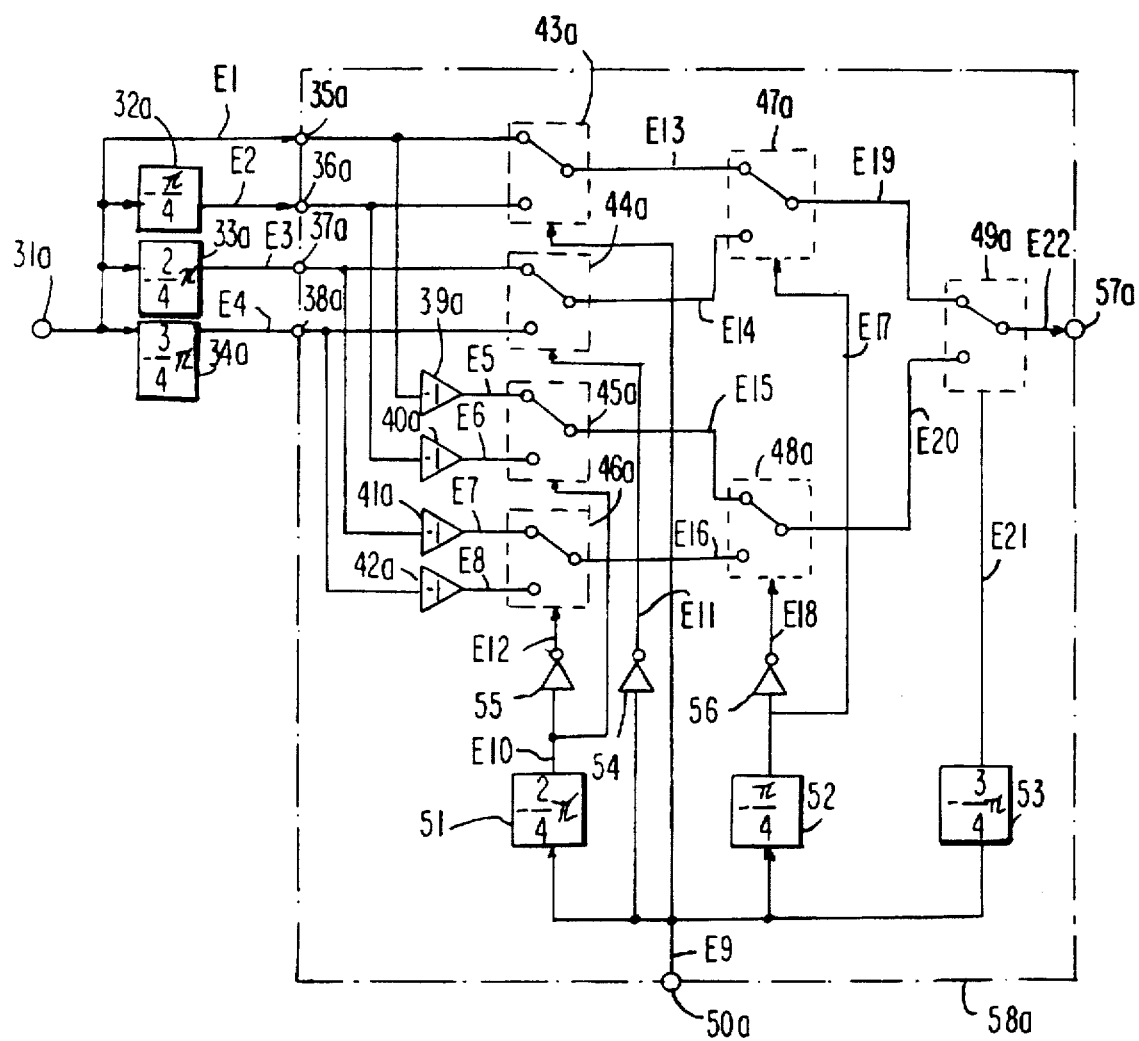
FIG. 6: Block diagram of the second working example of the frequency converting circuit of this invention.
Figure 7:
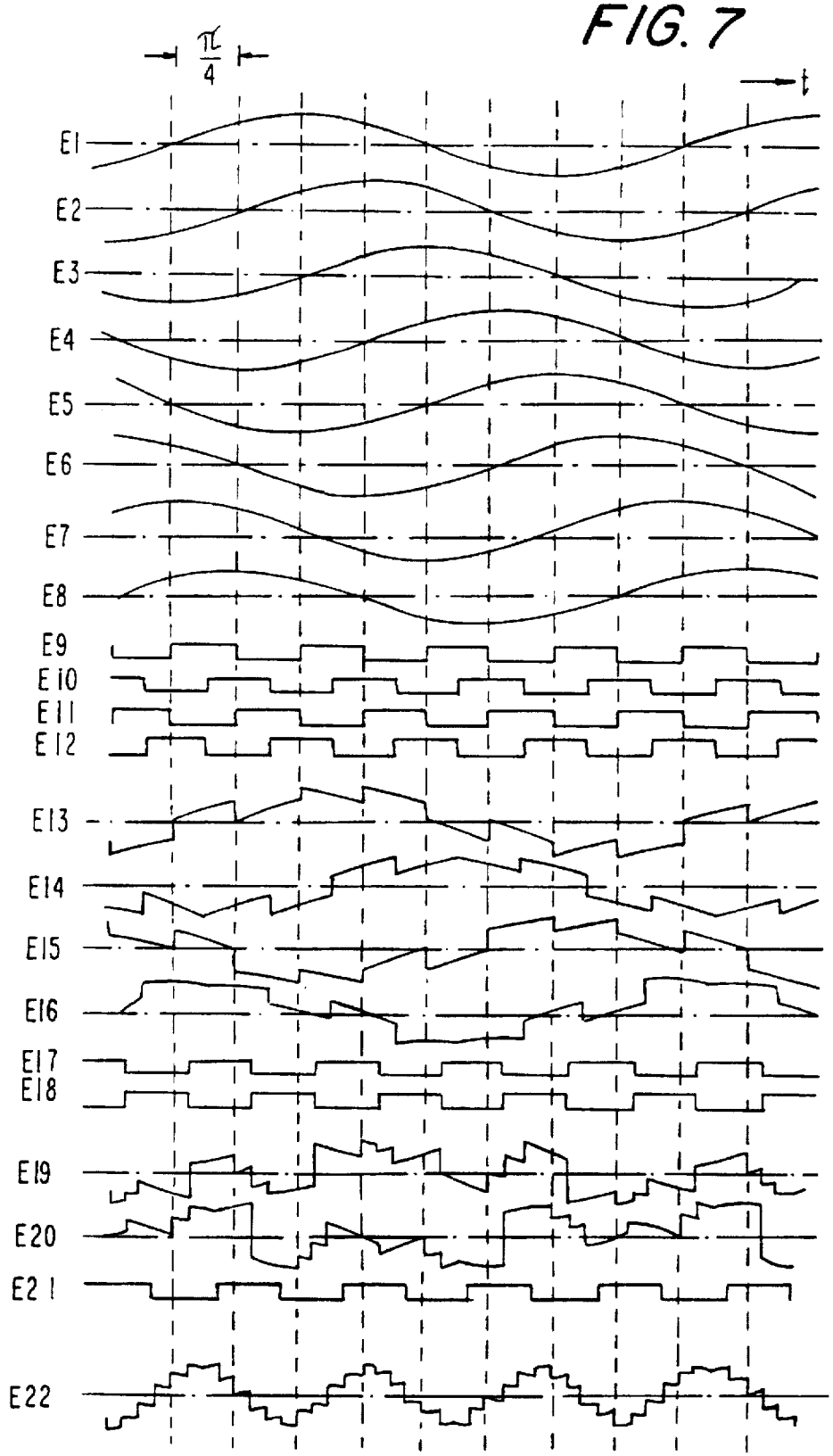
FIG. 7: Operating waveform chart of the circuit shown in FIG. 6

FIG. 6 consists of a block diagram of the second working example of the frequency converting circuit of this invention. FIG. 7 presents an operating waveform chart for the same. The following discussion will refer to both illustrations together.

FIG. 6 represents a frequency converting circuit as found in FIG. 4, but with the number of channels increased to eight.

In FIG. 6, the first input signal E1, which is input from input terminal 31a (below, refer to the waveform chart in FIG. 7), under goes phase division into channel signals E1–E8 through phase shifts into different respective phases via $-\pi/4$ [rad], $-2\pi/4$ [rad] and $-3\pi/4$ [rad] phase shift circuits 32a, 33a and 34a, and phase inversion amplifiers 39a, 40a, 41a, and 42a. Of the phase divided channel signals, channel signals E1 and E2 are supplied to switch 43a (first switching means), channel signals E3 and E4 are supplied to switch 44a (first switching means), channel signals E5 and E6 are supplied to switch 45a (first switching means), and channel signals E7 and E8 are supplied to switch 46a (first switching means).

For its part, the second input signal E9, which is input from input terminal 50a, is transformed into switch signals E9–E12 (first switch signals), switch signals E17 and E18 (second switch signals) and switch signal E21 (third switch signal) via phase shift circuits 51, 52, and 53 and inverters 54, 55, and 56.

The switch signals generated thereby—E9–E12, E17 and E18, and E21—are supplied to switches 43a, 45a, 44a and 46a (first switching means), to switches 47a and 48a (second switching means) and to switch 49a (third switching means), respectively.

The switch signals E9–E12, E17 and E18, and E21 are switched at switches 43a, 45a, 44a, 46a, 47a, 48a and 49a, respectively. Switches 43a–46a output output signals E13–E16, while switches 47a and 48a output output signals E19 and E20, and switch 49a outputs output signal E22. Ultimately, this final output signal E22 is output from output terminal 57a with a frequency consisting of the difference between input signals E1 and E9.

Section 58a in the illustration, which is surrounded by a single-dot and dashed line, represents the portion implemented as an integrated circuit. 35a, 36a, 37a and 38a are the IC input terminals, while 57a is the output terminal.

If we were to invert the channel signals E1–E4 input to terminals 35a, 36a, 37a and 38a, for example, the result would be a frequency consisting of the sum of the first input signal E1 and the second input signal E9.

The circuit in FIG. 6 has more channels than that in FIG. 4, and as apparent from FIG. 7, the frequency converted output waveform for output signal E22 is even more refined than that for output signal E13 in FIG. 5. The reason is that the low pass filter (LPF) placed afterward to generate a low pass does not require any particular sharpness as a filter characteristic, and a simple LPF can generate a very good waveform.

<Working Example 3>

Figure 8:
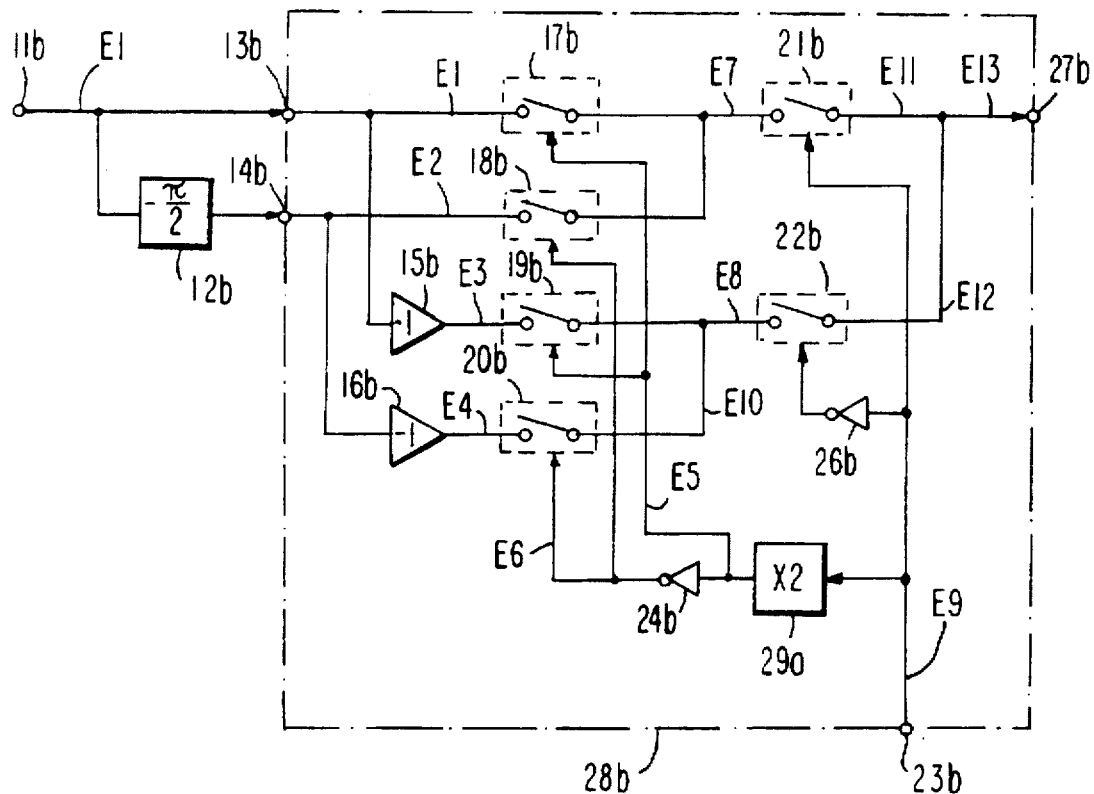
FIG. 8: Block diagram of the third working example of the frequency converting circuit of this invention.
Figure 9:
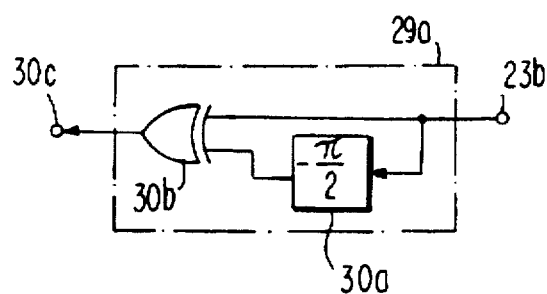
FIG. 9: Block diagram showing an example configuration of a frequency doubler.
Figure 10:
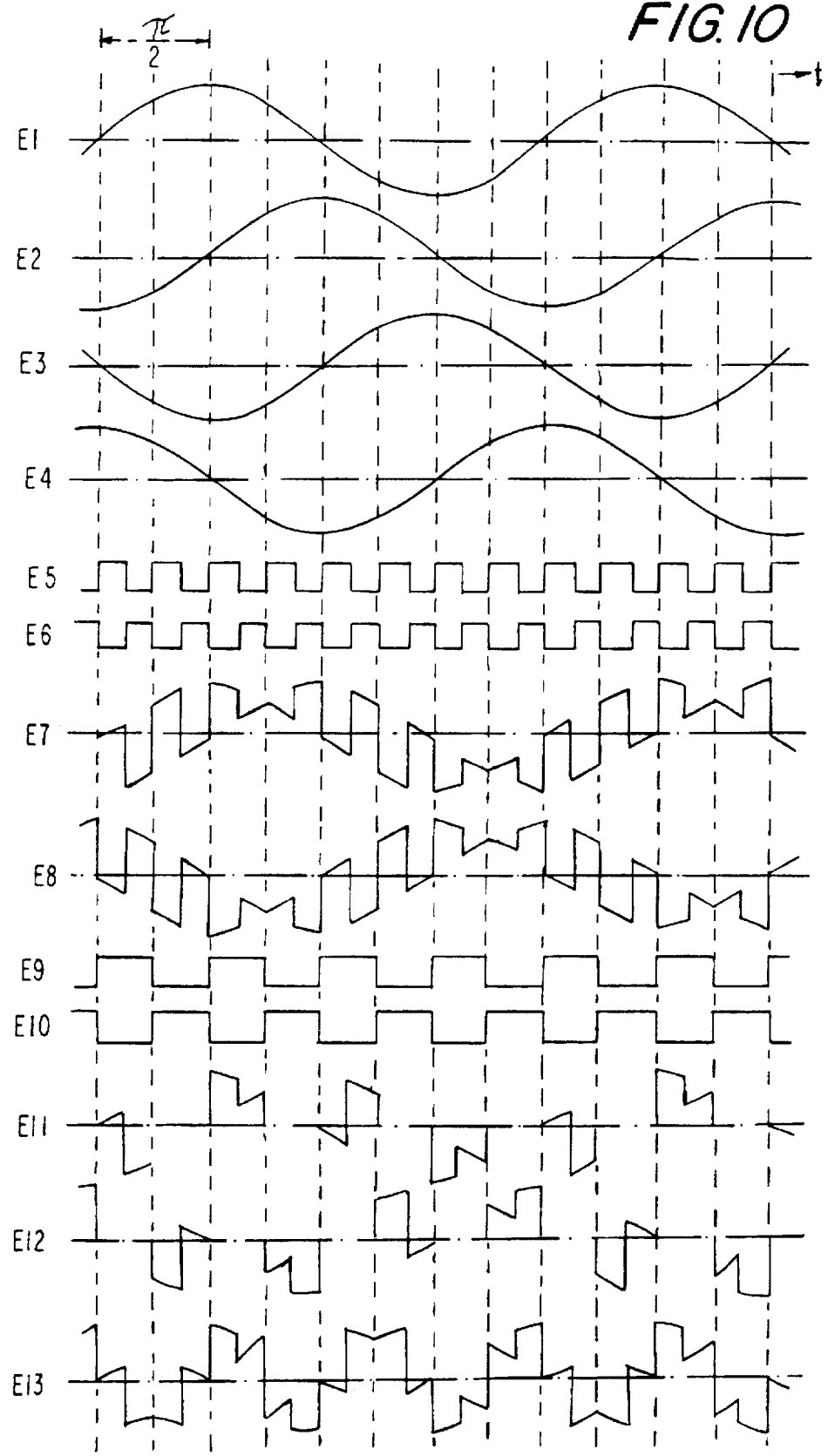
FIG. 10: Operating waveform chart of the circuit shown in FIG. 8.

FIG. 8 consists of a block diagram of the third working example of the frequency converting circuit of this invention. FIG. 9 presents a block diagram of an example of a frequency doubler, and FIG. 10 presents an operating waveform chart. The following discussion will refer to all three illustrations together.

The frequency conversion circuit shown in FIG. 8 represents a specific example of circuit constitution of the circuit in FIG. 3. In FIG. 8, the channel signals E1, E2, E3, and E4 shown in FIG. 10 are input as the channel signals S1, S2, S3 and S4 in the circuit in FIG. 3. The same signals are used for switch signals C1 and C2, while a signal with double the frequency of switch signal C3 is used for the frequency of switch signal C1.

The circuit in FIG. 8 differs in two main respects from the circuit in FIG. 4. First of all, it uses a frequency doubler as the switch signal generator circuit. Second, it generates switch signals with different frequencies.

In FIG. 8, 12b is a 31 π/2 [rad] phase shift circuit, 15b and 16b are phase inversion amplifiers, 24b and 26b are inverters, 29a is the frequency doubler, and 13b and 14b are input terminals for the IC section 28b.

In FIG. 8, the first input signal E1, which is input from input terminal 11b, undergoes phase division into channel signals E1–E4, each of which has a different phase. These phase-divided channel signals E1–E4 are supplied to switches 17b–20b, respectively.

The second input signal E9, which is input from input terminal 23b, is transformed into switch signals E5, E6, E9 and E10 via inverters 24b and 26b and via the frequency doubler 29a. The switch signals generated in this manner—E5, E6, E9 and E10—are supplied to switches 18b and 20b and switches 21b and 22b, respectively.

Switch signals E5, E6, E9 and E10 accordingly throw the switches 17b, 19b, 18b, 20b, 21b, and 22b. Switches 17b and 18b yield output signal E7, switches 19b and 20b yield output signal E8, and switches 21b and 22b yield output signals E11 and E12, respectively. The final result is output signal E13, which has a frequency corresponding to the difference between the two input signals E1 and E9, and is output from output terminal 27b.

As shown in FIG. 9, frequency doubler 29a in this example is constituted from a –π/2 [rad] phase shift circuit 30a and an exclusive OR (XOR) gate 30b. Input signals input from input terminal 23b undergo frequency doubling, and the resulting signal is output from output terminal 30c.

<Working Example 4>

Figure 11:
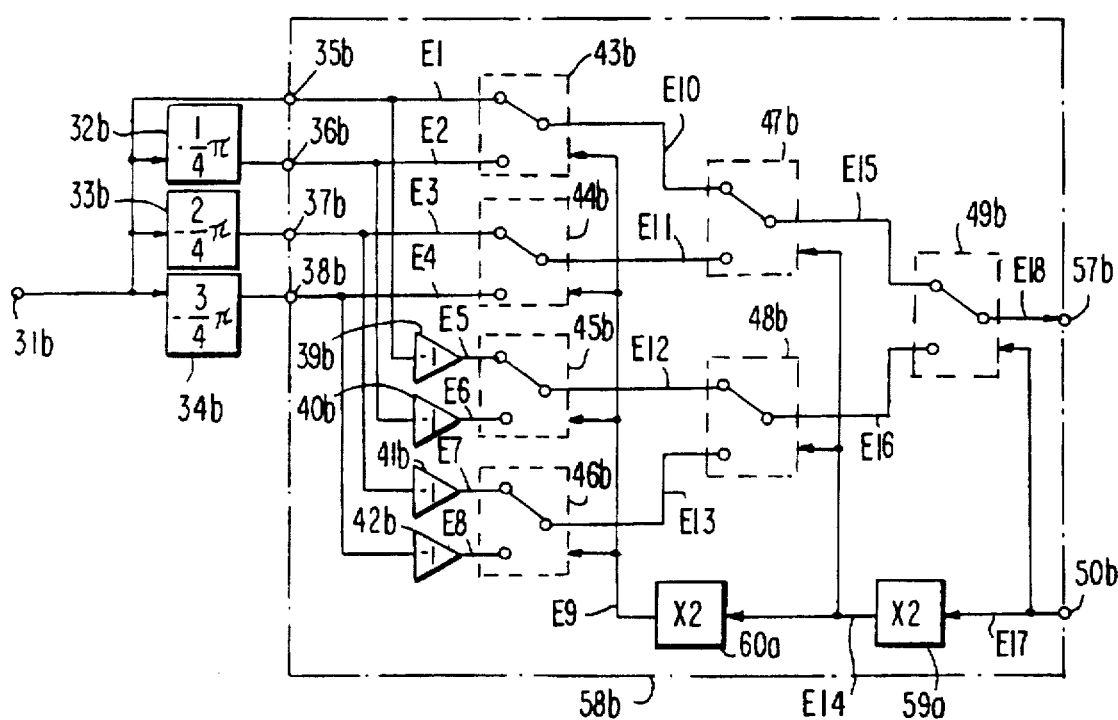
FIG. 11: Block diagram of the fourth working example of the frequency converting circuit of this invention.
Figure 12:
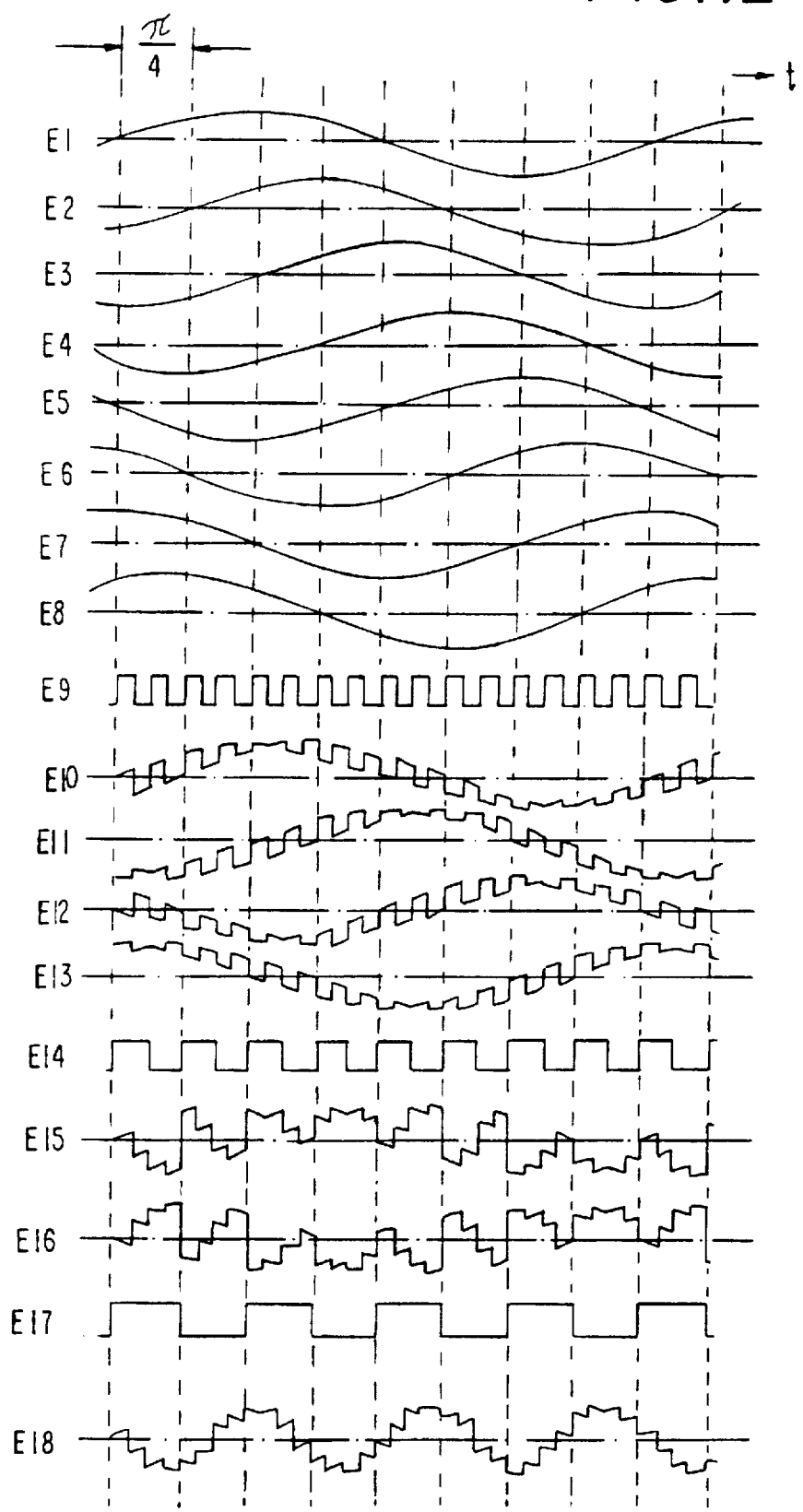
FIG. 12: Operating waveform chart of the circuit shown in FIG. 11.

FIG. 11 consists of a block diagram of the fourth working example of the frequency converting circuit of this invention. FIG. 12 presents an operating waveform chart for the same. The following discussion will refer to both illustrations together.

FIG. 11 represents the same type of frequency converting circuit as found in FIG. 9 but with the number of channels increased to eight. The circuit in FIG. 11 differs with to respects to the circuit in FIG. 6 in that it uses a frequency doubler as the switch signal generator circuit.

In FIG. 11, 32b, 33b, and 34b are –π/4 [rad], –2 π/4 [rad] and –3 π/4 [rad] phase shift circuits.

39b, 40b, 41b and 42b are phase inversion amplifiers, 59a and 60a are frequency doublers, and 35b, 36b, 37b, and 38b are input terminals for IC section 58b.

In FIG. 11, the first input signal E1, which is input from input terminal 31b, undergoes phase division into channel signals E1–E8, each of which has a different phase. The phase-divided channel signals E1–E8 are supplied to switches 43b–46b, respectively.

The second input signal E17, which is input from input terminal 50b, is transformed into the following:

Switch signal E17;

Switch signal E14, which has undergone frequency doubling via frequency doubler 59a; and Switch signal E9, which has undergone frequency doubling via frequency doubler 60a.

The switch signals generated in this manner—E17, E14 and E9—throw switches 49b, 47b, 48b and 43–46b, respectively. Switches 43b–46b yield output signals E10–E13, switches 47b and 48b yield output signals E15 and E16, and switch 49b yields output signal E18. The final result is output signal E18, which has a frequency corresponding to the difference between the frequencies of the two input signals E1 and E17, and is output from output terminal 57b.

<Working Example 5>

Figure 13:
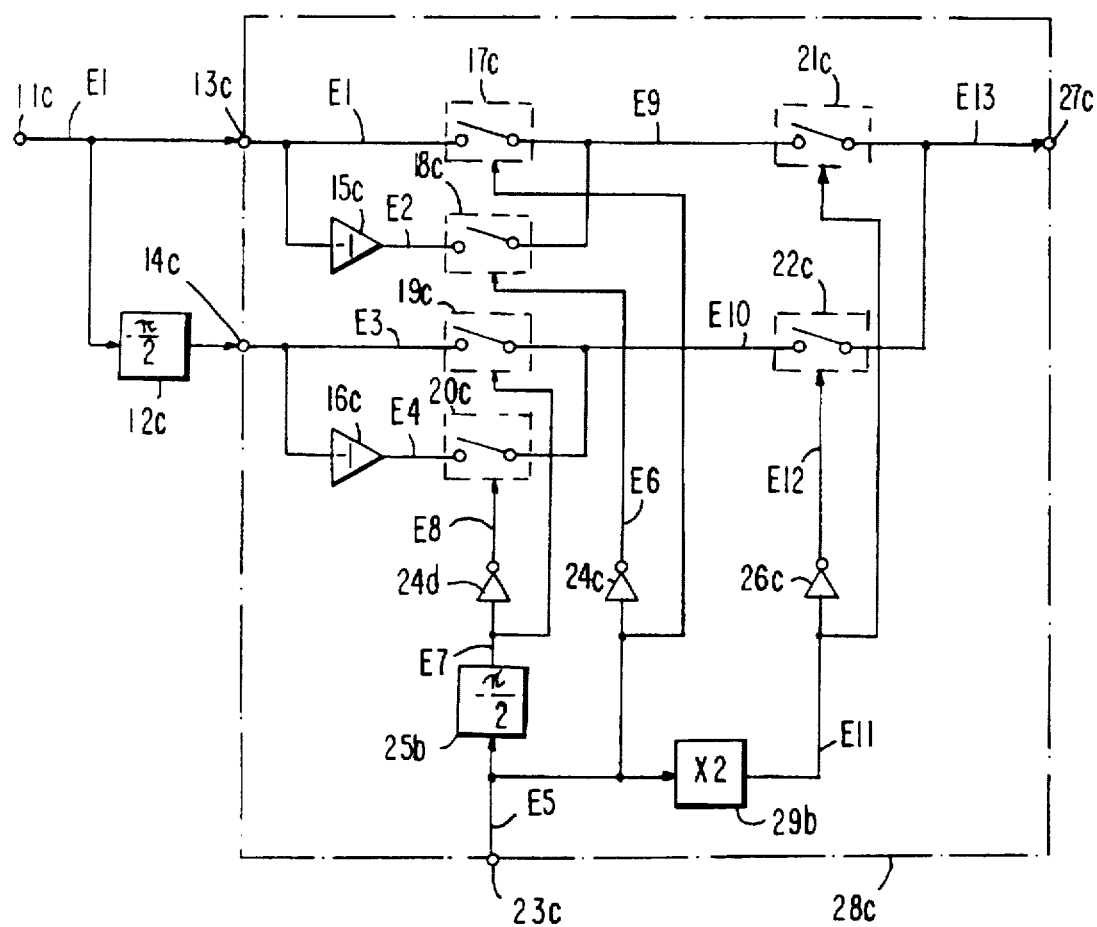
FIG. 13: Block diagram of the fifth working example of the frequency converting circuit of this invention.
Figure 14:
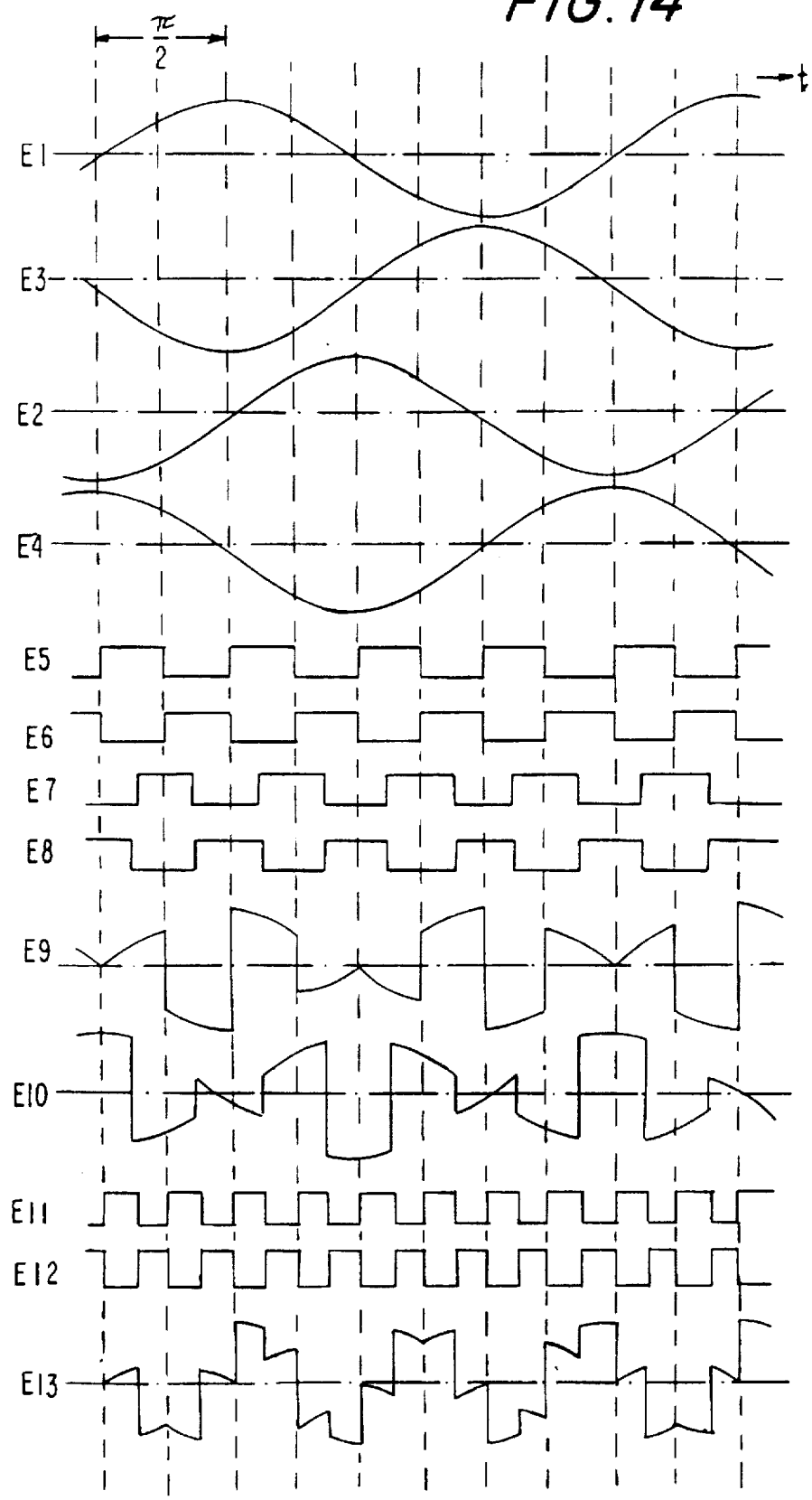
FIG. 14: Operating waveform chart of the circuit shown in FIG. 13.

FIG. 13 consists of a block diagram of the fifth working example of the frequency converting circuit of this invention. FIG. 14 presents an operating waveform chart for the same. The following discussion will refer to both illustrations together.

The frequency converting circuit in FIG. 13 represents a specific working example of the circuit in FIG. 3. In FIG. 13, the channel signals E1, E3, E2, and E4 shown in FIG. 14 are input as the channel signals S1, S2, S3, and S4 in the circuit in FIG. 3. For switch signals C1 and C2 signals are used with the same frequency but with a phase difference of π/2 [rad]. The frequency of switch signal C3 is double that of switch signal C1.

In addition, the circuit in FIG. 13 differs in two main respects from the circuit in FIG. 4. First of all, it uses a frequency doubler as the switch signal generator circuit. Second, it generates switch signals with either different frequencies or different phases.

In FIG. 13, 12c and 25b are $-\pi/2$ [rad] phase shift circuits, while 15c and 16c are phase inversion amplifiers. 29b is a frequency doubler, and 13c and 14c are input terminals for the IC section 28c.

In FIG. 13, the first input signal E1, which is input from input terminal 11c, undergoes phase division into channel signals E1, E2, E3 and E4, each of which has a different phase. These phase divided channel signals E1–E4 are supplied to switches 17c, 19c, 18c and 20c, respectively.

The second input signal E5, which is input from input terminal 23c, is transformed into switch signals E5–E8 and E11 and E12 via inverters 24c, 24d and 26c, phase shift circuit 25b, and frequency doubler 29b. The switch signals generated in this manner—E5–E8 and E11 and E12—are supplied to switches 17c–22c, respectively.

Switch signals E5–E8 and E11 and E12 accordingly throw switches 17c–22c. Switches 17c and 18c yield output signal E9, switches 19c and 20c yield output signal E10, and switches 21c and 22c yield respective output signals. The final result is output signal E13, which has a frequency corresponding to the difference between the frequencies of the two input signals E1 and E5, and is output from output terminal 27c.

<Working Example 6>

Figure 15:
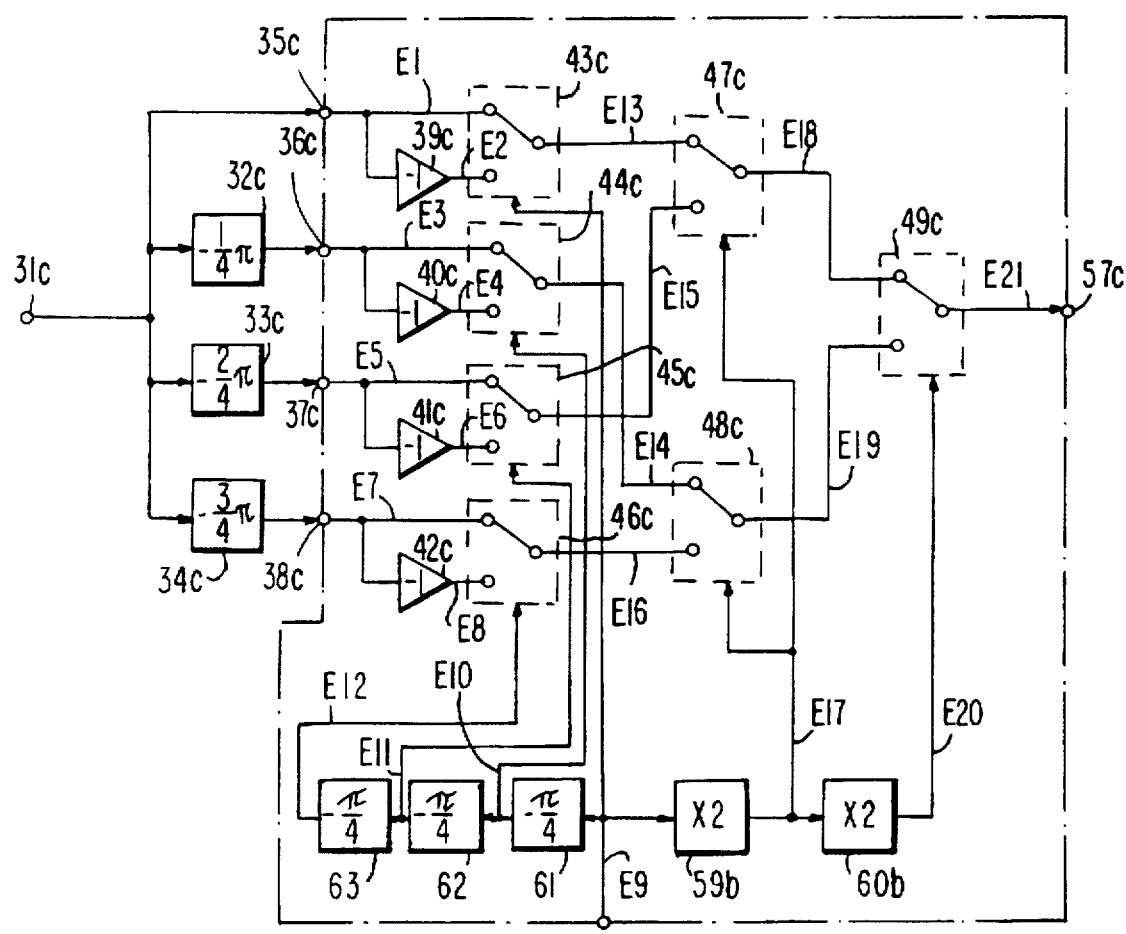
FIG. 15: Block diagram of the sixth working example of the frequency converting circuit of this invention.
Figure 16:
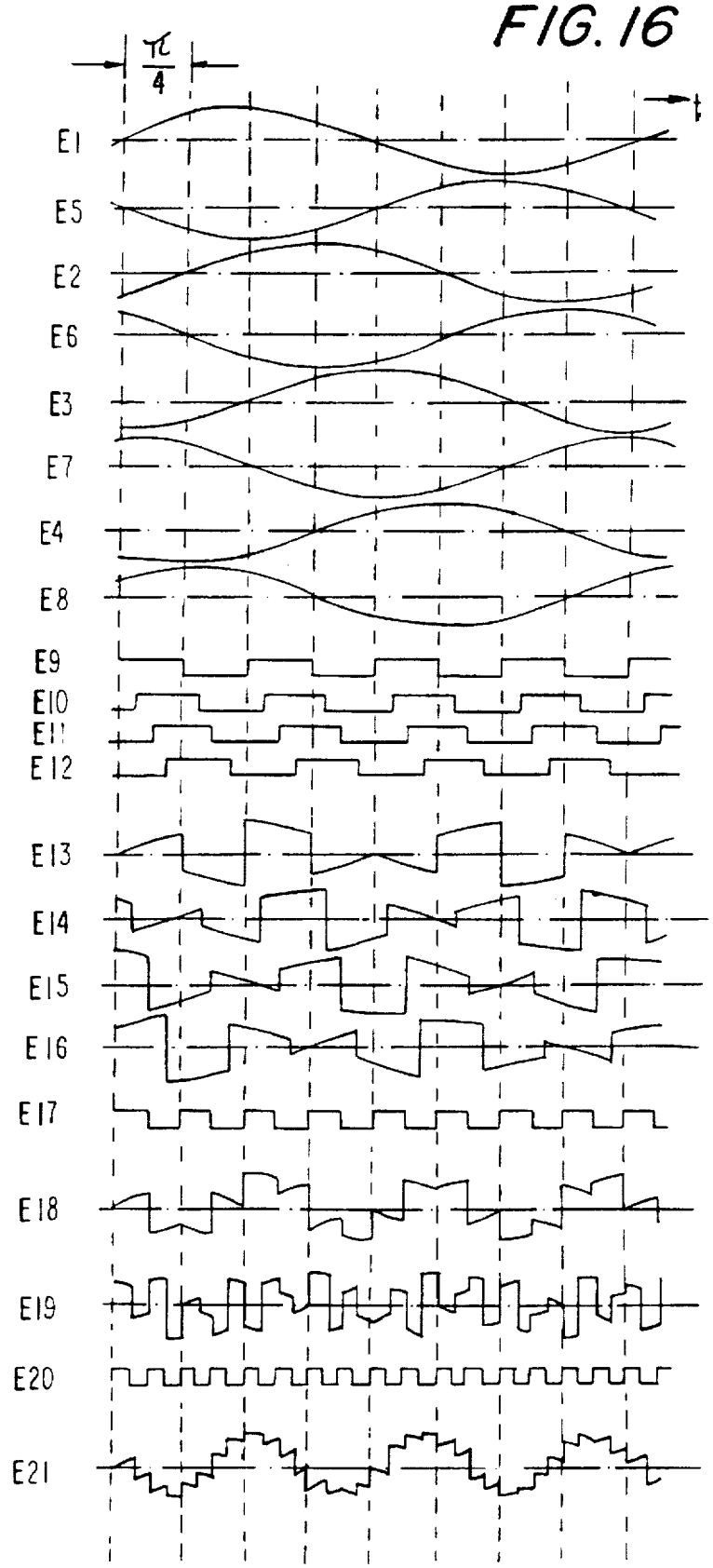
FIG. 16: Operating waveform chart of the circuit shown in FIG. 15.

FIG. 15 consists of a block diagram of the sixth working example of the frequency converting circuit of this invention. FIG. 16 presents an operating waveform chart for the same. The following discussion will refer to both illustrations together.

FIG. 15 represents the same type of frequency converting circuit as found in FIG. 13 but with the number of channels increased to eight. The circuit in FIG. 15 differs with respect to the circuit in FIG. 6 in that it uses a phase shift circuit and frequency doubler as the switch signal generator circuit.

In FIG. 15, 32c, 33c, and 34c respectively are $-\pi/4$ [rad], $-2\pi/4$ [rad] and $-3\pi/4$ [rad] phase shift circuits. 39c, 40c, 41c and 42c are phase inversion amplifiers, and 61, 62 and 63 are $-\pi/4$ [rad] phase shift circuits. 59b and 60b are frequency doublers, and 35c, 36c, 37c, and 38c are input terminals for IC section 58c.

In FIG. 15, the first input signal E1, which is input from input terminal 31c, undergoes phase division into channel signals E1–E8, each of which has a different phase. These phase divided channel signals E1–E8 are supplied to switches 43c–46c.

The second input signal E9, which is input from input terminal 50c, is transformed into switch signal E9 and switch signals E10–E12, the latter of which are respectively phase-shifted by $-\pi/4$ [rad], $-2\pi/4$ [rad], and $-3\pi/4$ [rad] via phase-shift circuits 61, 62 and 63 on switch signal E9.

The switch signals generated in this manner—E9, E10, E11 and E12—are supplied to switches 43c–46c, respectively. Next, frequency doublers 59b and 60b generate switch signal E17, which is the result of frequency doubled from switch signal E9 at frequency doubler 59b, and switch signal E20, which is the result of frequency quadrupled at frequency doublers 59b and 60b. These signals are supplied to switches 47c, 48c and 49c, respectively.

Switch signals E9, E10, E11, E12, E17 and E20, supplied respectively, accordingly throw switches 43c–46c, 47c, 48c, and 49c. Switches 43c–46c yield output signals E13–E16, switches 47c and 48c yield output signals E18 and E19, and switch 49c yields output signal E21. The final result is output signal E21, which has a frequency corresponding to the difference in frequency between the two input signals E1 and E9, and is output from output terminal 57c.

<Basic Aspect 2>

Figure 17:
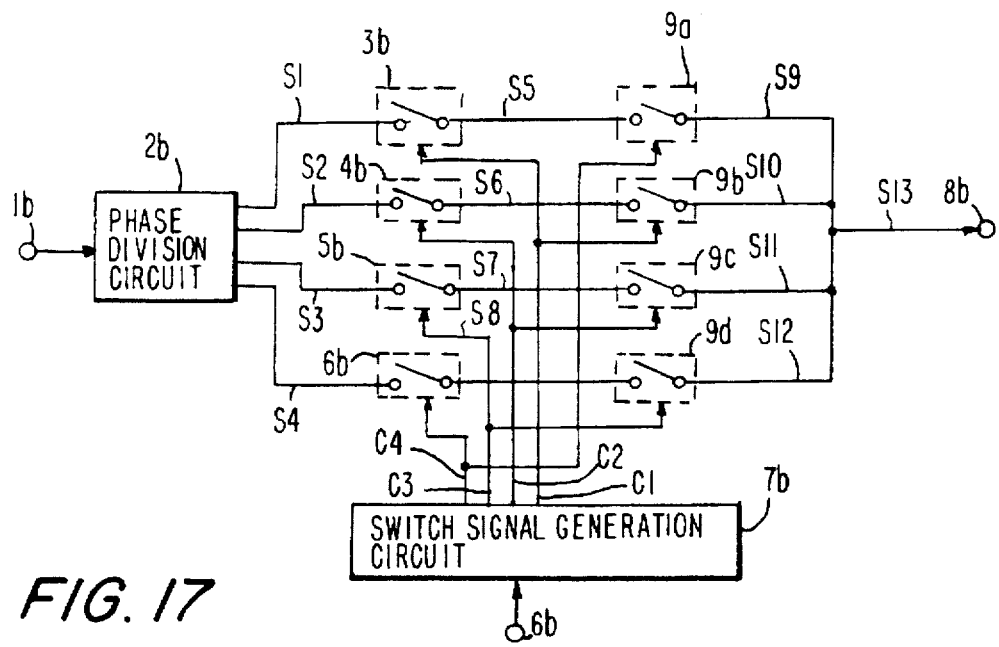
FIG. 17: Block diagram showing another example of a basic aspect of the frequency converting circuit of this invention.

FIG. 17 consists of a block diagram illustrating another example of a basic aspect of the frequency converting circuit of this invention. We shall discuss the basic operations with reference to FIG. 17. The first input signal S1 is supplied via input terminal 1b. The first input signal S1 is transformed into multiple phase divided signals (channel signals, four channels in this example) S1–S4, each of which has a different phase, by phase division circuit 2b. These phase divided signals S1–S4 are supplied respectively to switches 3b, 4b, 5b and 6b (first switching means).

Output signals S5, S6, S7, and S8 from switches 3b, 4b, 5b, and 6b are supplied respectively to switches 9a, 9b, 9c, and 9d (second switching means).

The second input signal C1 is supplied to input terminal 6b. The switch signal generator circuit 7b generates multiple switch signals C1–C4 from the second input signal C1 (the first switch signal supplied to the first switching means and the second switch signal supplied to the second switching means). The switch signals generated in this fashion— C1–C4—are supplied to switches 3b and 9b, to switches 4b and 9c, to switches 5b and 9d, and to switches 6b and 9a, respectively.

The respectively supplied switch signals C1–C4 accordingly throw these various pairs of switches (3b and 9b, 4b and 9c, 5b and 9d, 6b and 9a). Switches 3b, 4b, 5b and 6b yield output signals S5, S6, S7 and S8, while switches 9a, 9b, 9c and 9d yield output signals S9, S10, S11 and S12. The final result is output signal S13, which has undergone frequency conversion of the first input signal S1 in relation to the second input signal C1 and which is output from output terminal 8b.

This example makes use of four channels; however, if the number of channels is increased, the number of switch signals and number of switches can be increased accordingly.

<Working Example 7>

Figure 18:
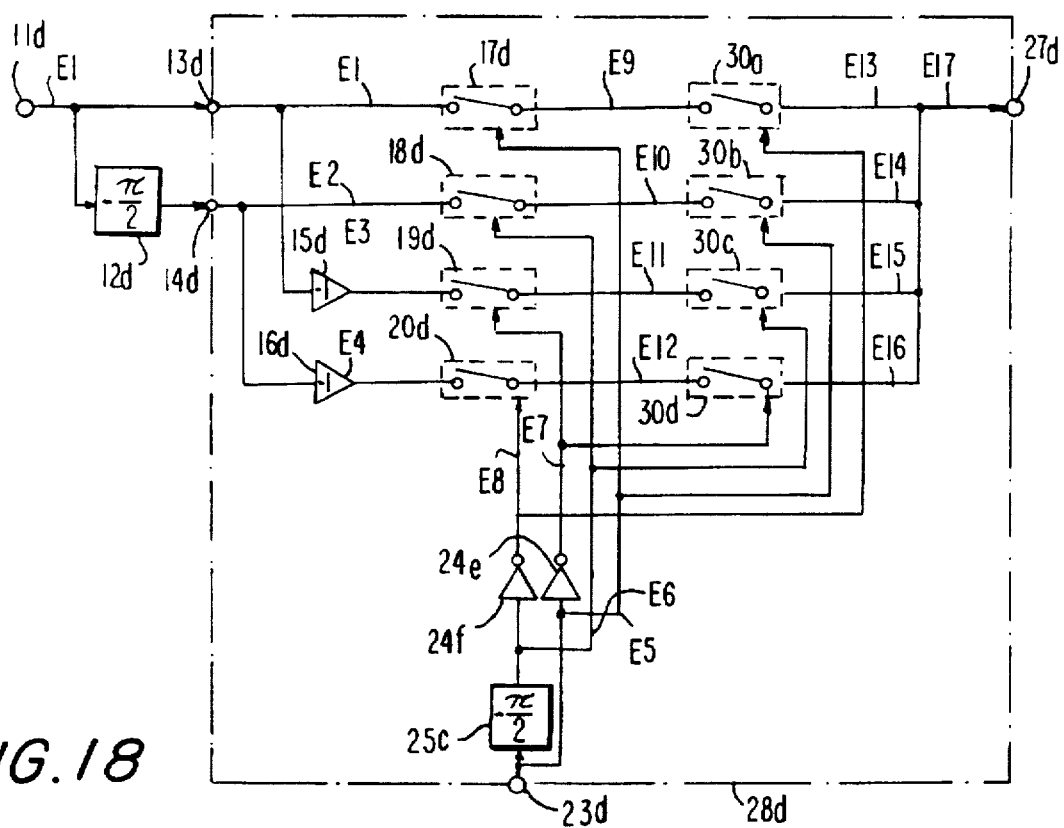
FIG. 18: Block diagram of the seventh working example of the frequency converting circuit of this invention.
Figure 19:
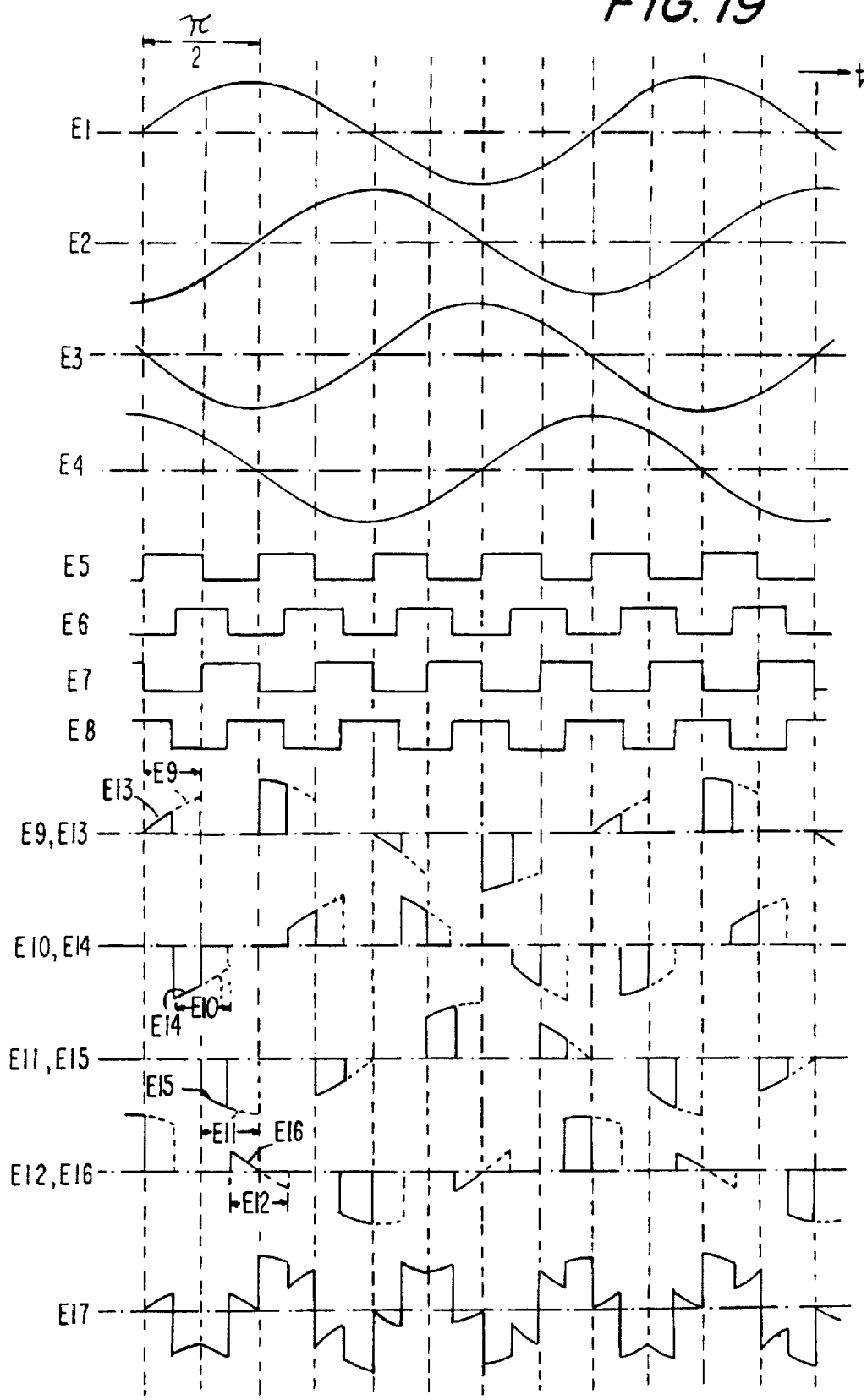
FIG. 19: Operating waveform chart of the circuit shown in FIG. 18.

FIG. 18 consists of a block diagram of the seventh working example of the frequency converting circuit of this invention. FIG. 19 presents an operating waveform chart for the same. The following discussion will refer to both illustrations together.

FIG. 18 represents one specific circuit configuration of the seventh working example of the frequency converting circuit of this invention.

In FIG. 18, 12d and 25c are $-\pi/2$ [rad] phase shift circuits, 15d and 16d are phase inversion amplifiers, 24e, 24f is an inverter, and 13d and 14d are input terminals for the IC section 28d.

In FIG. 18, the first input signal E1, which is input from input terminal 1id, undergoes phase division into channel signals E1–E4, each of which has a different phase. These phase divided channel signals E1–E4 are supplied to switches 17d–20d, respectively. Output signals E9–E12 from switches 17d–20d are supplied to switches 30a–30d, respectively.

The second input signal E5, which is input from input terminal 23d, is transformed into switch signals E5–E8 via phase shift circuit 25c and inverters 24e and 24f. The switch signals generated in this manner—E5–E8—are supplied to switches 17d and 30b, switches 18d and 30c, switches 19d and 30d and switches 20d and 30a, respectively. For example, the phase difference between the switch signals E5 and E8, which switch the channel signals E1 and E9 generated from the first input signal E1, is (2 π/channel count (4)+π) [rad].

The respectively supplied switch signals E5–E8 accordingly throw these pairs of switches 17d and 30b, 18d and 30c, 19d and 30d, and 20d and 30a. Switches 17d–20d yield output signals E9–E12 (in the waveform chart in FIG. 19, the signal waveforms for E9–E12 have an amplitude of π/4), which then pass through switches 30a–30d to yield output signals E13–E16. The final result is output signal E17, which has a frequency corresponding to the difference in frequency between input signals E1 and E5, and is output from output terminal 27d.

<Working Example 8>

Figure 20:
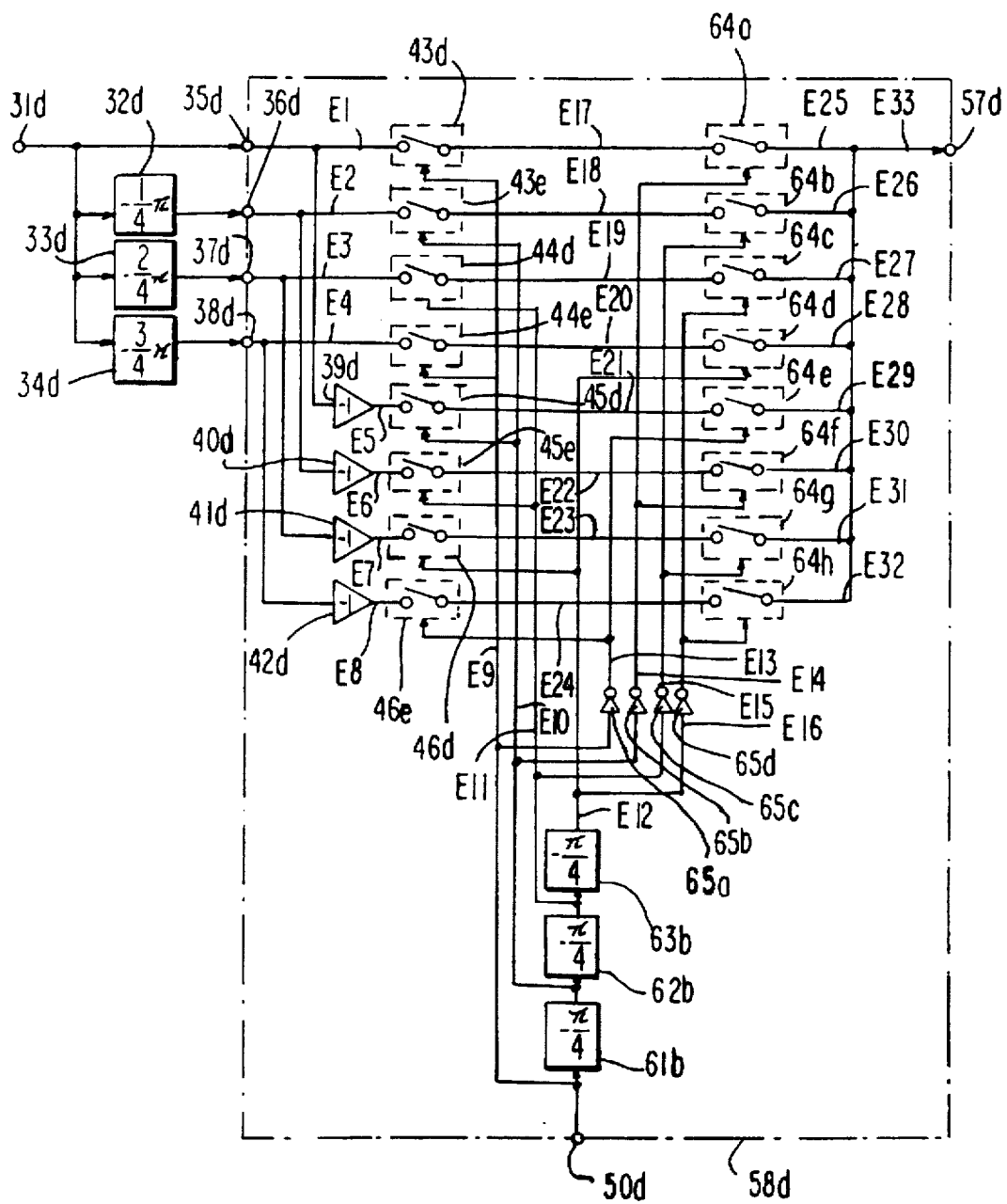
FIG. 20: Block diagram of the eighth working example of the frequency converting circuit of this invention.
Figure 21:
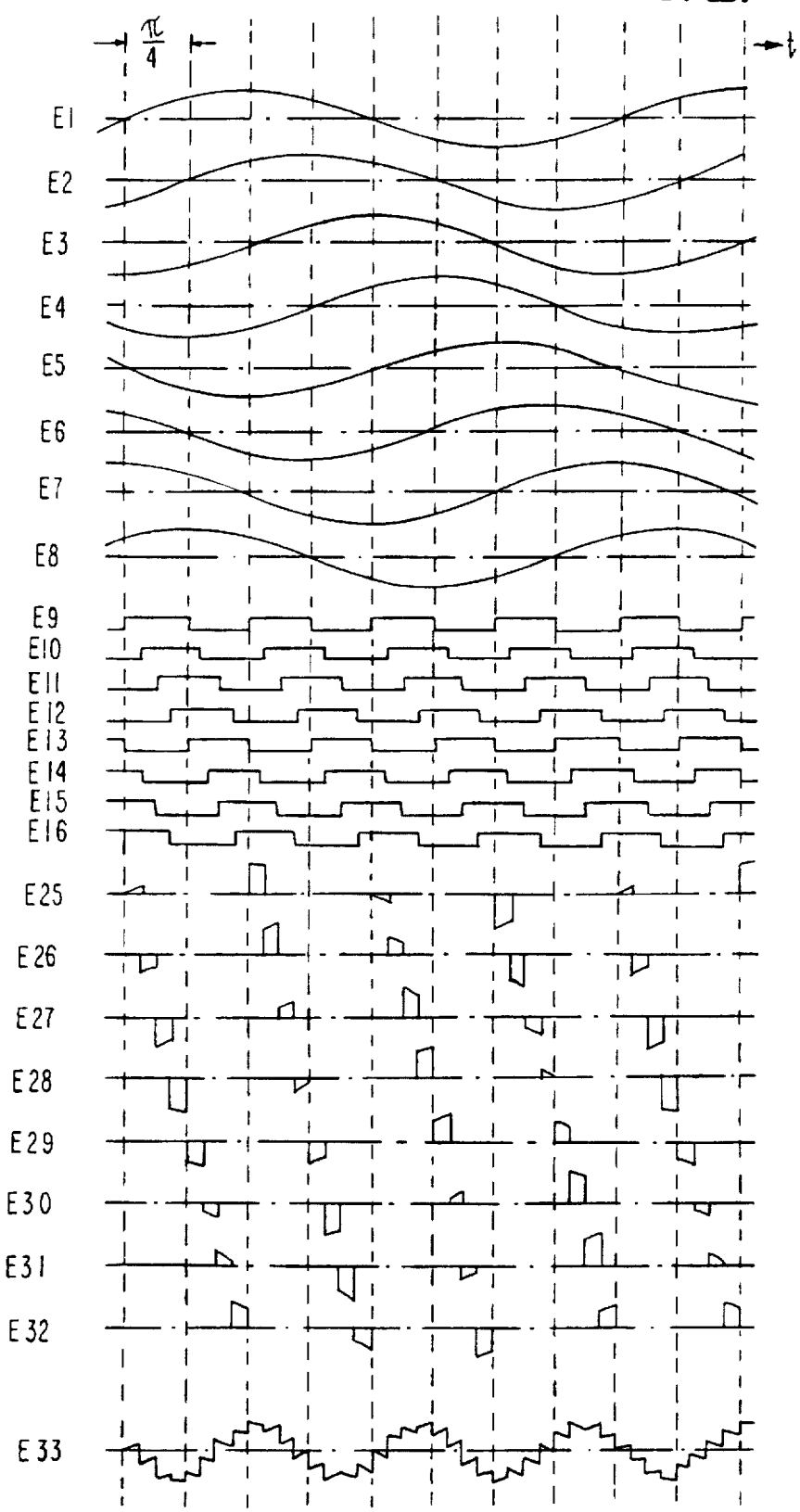
FIG. 21: Operating waveform chart of the circuit shown in FIG. 20.

FIG. 20 consists of a block diagram of the eighth working example of the frequency converting circuit of this invention. FIG. 21 presents an operating waveform chart for the same. The following discussion will refer to both illustrations together.

FIG. 20 represents the same type of frequency converting circuit as found in FIG. 18 but with the number of channels increased to eight.

In FIG. 20, 32d, 33d and 34d are −π/4 [rad], −2 π/4 [rad] and −3 π/4 [rad] phase shift circuits, respectively. 39d, 40d, 41d and 42d are phase inversion amplifiers, and 61b, 62b and 63b are −π/4 [rad] phase shift circuits. 65a–65d are inverters, and 35d, 36d, 37d and 38d are input terminals for IC section 58d.

In FIG. 20, the first input signal E1, which is input from input terminal 31d, undergoes phase division into channel signals E1–E8, each of which has a different phase. These phase divided channel signals E1–E8 are supplied to switches 43d–46e. These switches 43d–46e generate output signals E17–E24, which are supplied to switches 64a–64h.

The second input signal E9, which is input from input terminal 50d, is tranformed into the following:

Switch signal E9; and

Switch signals E10–E12, which are respectively −π/4 [rad], −2 π/4 [rad] and −3 π/4 [rad] phase-shifted by phase shift circuits 61b, 62b, and 63b from switch signal E9.

The switch signals generated in this manner —E9, E10, E11 and E12—are supplied to switches 43d and 44e, switches 43e and 45d, switches 44d and 45e, and switches 46d and 64d, respectively.

In addition, switch signals E9–E12 are transformed into switch signals E13–E16 through phase inversion via inverters 65a–65d, respectively. The switch signals generated in this manner—E13–E16—are supplied to switches 46e and 64e, switches 64a and 64f, switches 64b and 64g, and switches 64c and 64h. For example, the phase difference between switch signals E9 and E14, which respectively switch the channel signals E1 and E17 generated from input signal E1, is (2 π/channel count 8+π) [rad].

Respective switch signals E9, E10, E11, E12, E13, E14, E15, and E16 accordingly throw these various switches 43d, 44e, 43e, 45d, 44d, 45e, 46d, 64d, 46e, 64e, 64a, 64f, 64b, 64g, 64c, and 64h. Switches 43d–46e yield output signals E17–E24. Output signals E17–E24 yield output signals E25–E32 via switches 64a–64h. The final result is output signal E33, which has a frequency corresponding to the frequency difference between the two input signals E1 and E9.

The principle described above is not limited to this working example. The circuit can easily be arranged to adapt to any number of channels produced by phase division of the first input signal, the number of channels being 2n (where n is any natural number of 2 or greater).

Figure 1:
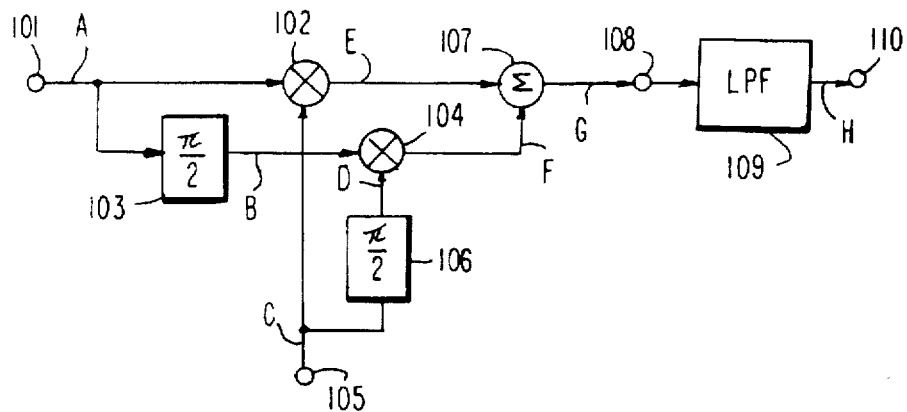
FIG. 1: Block diagram of an existing frequency converting circuit.
Figure 2:
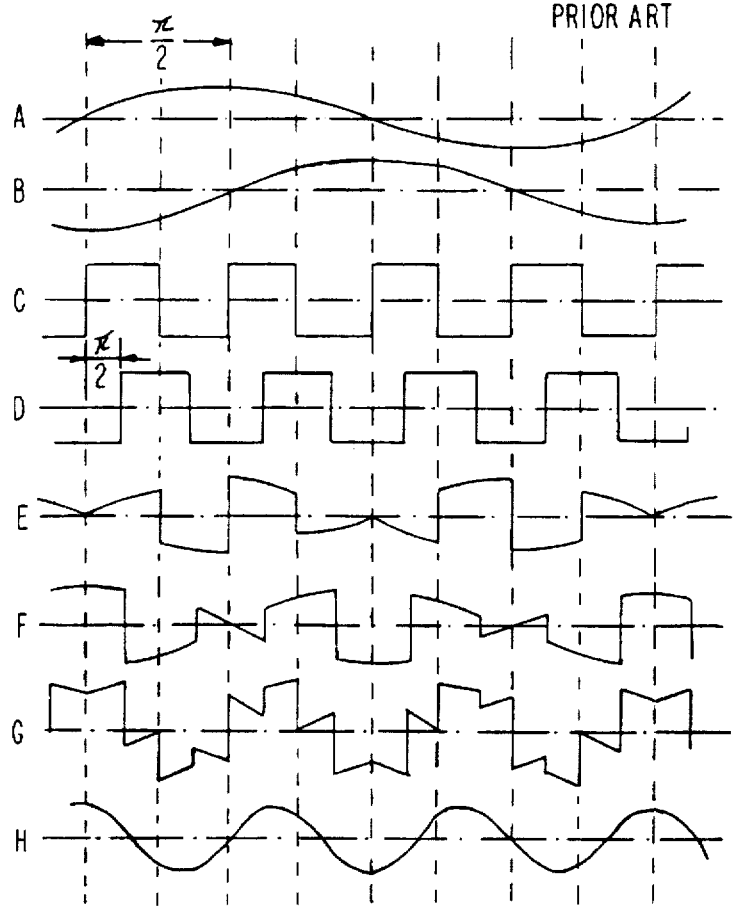
FIG. 2: Operating waveform chart of the circuit shown in FIG. 1.
Figure 22:
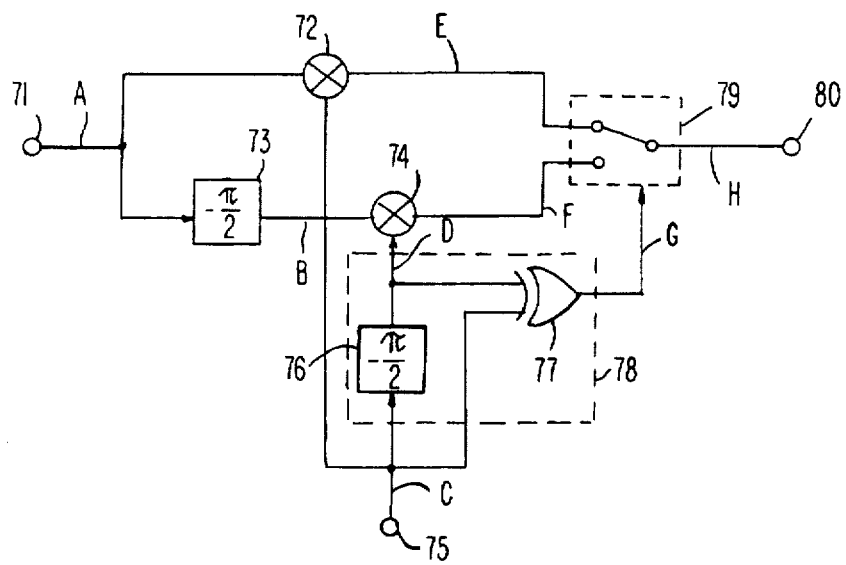
FIG. 22: Block diagram showing an example of improvement over the existing type circuit shown in FIG. 1.
Figure 23:
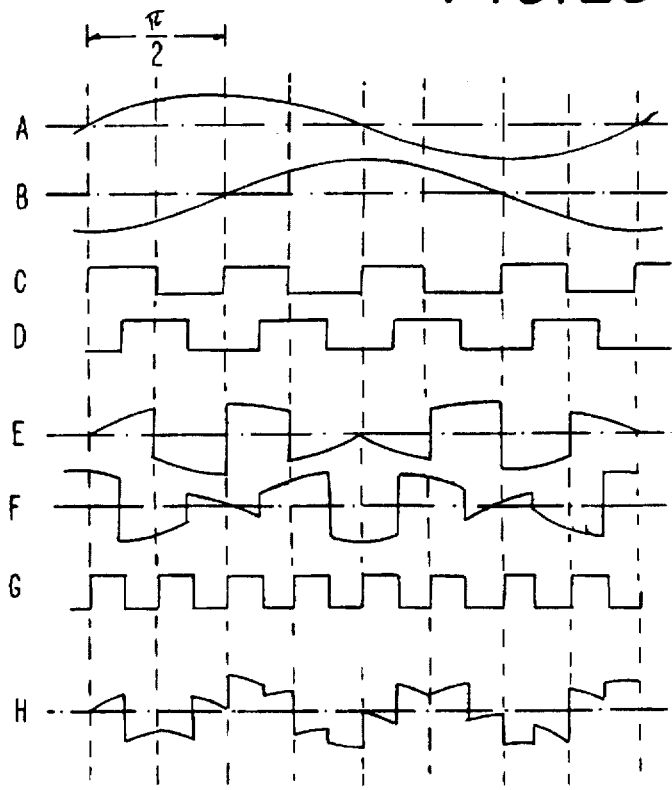
FIG. 23: Operating waveform chart of the circuit shown in FIG. 22.

FIG. 22 shows an example of improvement on the previously existing type of frequency converting circuit shown in FIG. 1. FIG. 23 presents an operating waveform for the circuit in FIG. 22. The following discussion will refer to both illustrations together.

As stated above, whenever the mixing balance is disturbed in the addition or subtraction of the multiplier outputs in the existing model circuit shown in FIG. 1, an unwanted frequency spectrum generates, and filtering also results in difficult and sometimes fatal problems.

The circuit in FIG. 22 dispenses with mixing processing in addition and subtraction, thereby eliminating the problem of frequency conversion characteristic degradation resulting from loss of balance in mixing.

In FIG. 22, the first input signal (channel signal) A, which is input from input terminal 71, is supplied both to the multiplier 72 and the −π/2 [rad] phase shift circuit 73, where the signal is transformed into the −π/2 [rad] phase-shifted signal B and supplied to multiplier 74.

The second input signal C, which is input from input terminal 75, is supplied to multiplier 72 and to one of the input terminals in XOR gate 77, as well as to −π/2 [rad] phase shift circuit 76, where the signal is transformed into −π/2 [rad] phase-shifted signal D and supplied to multiplier 74 and to the other input terminal for XOR gate 77.

−π/b 2[rad] phase shift circuit 76 and XOR gate 77 together constitute frequency doubler 78. The second input signal C is doubled by frequency doubler 78, yielding as its output the XOR gate 77 output signal G.

Output signals E and F from multipliers 72 and 74 are supplied to switch 79, where signals E and F input from XOR gate 77 are switched by output signal G. The final result is output signal H, which has a frequency corresponding to the difference in frequencies between the two input signals, and is output at output terminal 80.

Thus, the circuit in FIG. 22 dispenses with mixing processing in addition and subtraction, thereby eliminating problems with degradation of frequency conversion characteristics resulting from loss of balance in mixing.

As described above, the frequency converting circuit of this invention eliminates problems observed in previously existing frequency adjusting circuits, problems with loss of balance in balance adjusters and in mixing in adding and subtracting circuits.

Since only switch circuits are used for frequency conversion all the way to the output terminals, there are no frequency-band limiting factors other than the switches themselves that enter in during the waveform conversion construction process in the switch circuit transmission system. Hence, no distortion occurs in waveform conversion, and ideal frequency conversion can be achieved.

If the base frequency and the frequency-multiplied base frequency of the two input signals use square waves with a duty rate of 50% as switch signal, switching operations tend to remain unstressed in the each of the switches, and thus problems with characteristic degradation are also unlikely to arise.

If there is no variance in the level of the phase division signal supplied to the switch circuits, and if the phase characteristics are ideal, frequency conversion occurs smoothly without any further adjustment. This design is well-suited to implementation in the form of an integrated circuit, and furnishes an optimal frequency converting circuit for application to signal side band modulators (SSB modulators) and a variety of other frequency conversion applications.

What is claimed is:

1. A frequency converting circuit for converting a frequency of a first input signal into another frequency in response to a second input signal, comprising:

a first multiplier, which multiplies the first input signal by the second input signal;

a first phase shift circuit, which performs a $-\pi/2$ degrees phase shift on the aforesaid first input signal;

a second phase shift circuit, which performs a $-\pi/2$ degrees phase shift on the aforesaid second input signal;

a second multiplier, which multiplies the output signal from the aforesaid first phase shift circuit by the output signal from the aforesaid second phase shift circuit;

a frequency doubler, which generates switch signals by frequency doubling of the aforesaid second input signal; and a switching means, in which the output signal from the aforesaid first multiplier and the output signal from the aforesaid second multiplier are switched according to the aforementioned switch signal for providing a converted signal and an output providing such another frequency.

2. The frequency converting circuit claimed in claim 1, wherein the aforesaid first input signal is an analog and the waveform of the aforesaid second input signal is a square wave.

3. The frequency converting circuit claimed in claim 1, wherein the aforesaid first input signal is a sine wave and the waveform of the aforesaid second input signal is a square wave.

* * * * *